(12) United States Patent
Suzuki et al.

(10) Patent No.: US 6,603,270 B2
(45) Date of Patent: Aug. 5, 2003

(54) DIRECT-VIEW-TYPE DISPLAY APPARATUS

(75) Inventors: Yoshio Suzuki, Kanagawa (JP); Yoshinari Matsuda, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/829,735

(22) Filed: Apr. 10, 2001

(65) Prior Publication Data
US 2002/0011784 A1 Jan. 31, 2002

(30) Foreign Application Priority Data
Apr. 11, 2000 (JP) .................................. P2000-109665

(51) Int. Cl.$^7$ ................................................ G09G 3/10
(52) U.S. Cl. .................... 315/169.3; 313/307; 313/506; 315/169.1; 345/206
(58) Field of Search ........................ 315/169.1, 169.3, 315/169.4; 345/206, 204; 313/505, 506, 238, 292, 306, 307

(56) References Cited

U.S. PATENT DOCUMENTS 4,888,077 A * 12/1989 Sohn ........................... 156/285
6,373,453 B1 * 4/2002 Yudasaka .................. 315/169.3

* cited by examiner

Primary Examiner—Don Wong
Assistant Examiner—Thuy Vinh Tran
(74) Attorney, Agent, or Firm—Jay H. Maioli

(57) ABSTRACT

An organic EL display, wherein fabrication is simplified, manufacturing cost is reduced, periodicity with which pixels are arrayed is maintained, picture quality is prevented from deteriorating due to a boundary between transparent substrates, and high resolution is realized. A plurality of organic thin-film EL elements (2) are formed on a single transparent substrate (1). Circuit substrates (5) in which driver circuits (6) for supplying signals to signal and scanning electrodes of the elements (2) are mounted are bonded to the elements (2). The circuit substrate has an end-sealing property and through-holes bored opposite the signal and scanning electrodes. The through-holes are covered by a conductive, end-sealing material. Signals are supplied from the driver circuit (6) to the signal and scanning electrodes through the conductive material. A portion of the organic EL element which is not bonded to the circuit substrate is covered by an end-sealing material.

9 Claims, 12 Drawing Sheets

DIRECT-VIEW-TYPE DISPLAY APPARATUS

BACKGROUND OF THE INVENTION

1. Field of the Invention

The present invention relates to a direct-view-type display apparatus using organic thin-film EL elements as display elements, for example, and particularly to a direct-view-type display apparatus suitable for realizing a large display screen.

2. Description of the Related Art

EL (electroluminescent) elements are known as a kind of light-emitting display elements. EL elements make use of an electro-luminescence as a principle which is a phenomenon in which a light is produced from a phosphor when applied with a voltage.

From a standpoint of a chemical composition of a light-emitting material, EL elements are classified into an inorganic EL element in which rare earth element serving as a center of light emission is added to a host material made of an inorganic compound and an organic EL element using a fluorescent organic compound. From a standpoint of a physical shape of a light-emitting material, EL elements are classified as a dispersion-type EL element using a powder-like light-emitting material and a thin-film EL element using a dense thin-film-like light-emitting material.

Since the organic thin-film EL element is able to display colors that matches with fluorescent colors of organic compounds so that colors can be selected with ease as compared with the inorganic EL element, it can be driven by a low drive voltage as compared with the inorganic EL element and it can easily be manufactured by microminiaturization as compared with the inorganic EL element, in recent years, it is receiving a remarkable attention as a display element for use in a direct-view-type display apparatus.

The direct-view-type display apparatus using this organic thin-film EL element (hereinafter simply referred to as an "organic EL display") has an advantage that it can be well confirmed visually as compared with display apparatus using a non-light-emitting display element such as a liquid crystal and has also an advantage that it can do with a low driving voltage as compared with display apparatus using a display element of another light-emitting type (e.g., plasma display and field-emission display) so that it consumes less power and it can be expected that ICs for driving this type of display element can be manufactured inexpensively.

In recent years, needs for enlarging display screens of various kinds of indoor and outdoor displays are increasing. In the organic EL display, when the size of the organic thin-film El element itself is increased, lengths of signal electrodes and scanning electrodes comprising the organic thin-film EL element are increased and resistance of these electrodes increase so that a drive voltage should be increased. For this reason, heretofore, it has been difficult to realize an organic EL display of a large picture screen. This is also true in other flat panel displays such as a PDP (plasma display panel), an FED (field-emission display) and an LCD (liquid-crystal panel).

FIG. 13 shows an example of an arrangement of this display unit. A display unit 51 is manufactured such that a protecting film (not shown) made of an inorganic compound such as GeO is formed on the surface of an organic thin-film EL element 53 formed on a glass substrate 52 or a light-curing resin layer (not shown) is formed directly or through an SiO2 film on which a glass plate 54 having the same area as that of the glass substrate 52 is tightly contacted and the glass plate 54 and the glass substrate 52 are bonded together at end portions of their plate surfaces by an adhesive agent 55 having an end-sealing property. FIG. 14 shows an example in which a plurality of display units 51 shown in FIG. 13 are disposed in a matrix fashion.

The reason that the organic thin-film EL element is sealed by the glass plate 54 and the adhesive agent 55 as shown in FIG. 13 is as follows. That is, an organic compound used in an organic layer of the organic thin-film EL element is considerably weak to water and oxygen, and metals comprising anodes and cathodes of the organic thin-film EL element also are oxidized in the air and their characteristics are deteriorated suddenly.

However, when the large picture screen of the organic EL display is realized by disposing a plurality of display units in a matrix fashion as described above, there are various disadvantages which will follow.

(a) Since each of the display units should be positioned with high accuracy in order to maintain a periodicity with which pixels are arrayed on the whole of the picture screen, a fabrication work becomes complicated and a manufacturing cost increases.

(b) After fabrication, there is a risk that a positional relationship between the display units is being shifted slightly with a change in the environment (temperature change, etc.) and the the passage of time, so that the periodicity of the pixels array will be lost.

(c) Since a boundary between the transparent substrates (glass substrate 52 in FIG. 13) of each display unit is visually spotted as a joint on the picture screen, a picture quality is deteriorated.

(d) Since needs for increasing resolution as well as the size of the picture screen also are increasing, pitches between pixels should be minimized in order to meet the above needs. However, according to the sealing method in which the glass substrates are bonded at their end portions as shown in FIG. 13, since the organic thin-film EL element cannot be formed on the end portions (portions of widths L in the sheet of drawing) of the glass substrate surfaces (i.e., pixel cannot be provided), if the pixel pitch is increased at least twice this width L, there cannot be maintained the periodicity with which the pixels are arrayed on the whole of the picture screen. Accordingly, it is difficult to increase resolution.

In view of the aforesaid aspects, the present invention is intended to realize the organic EL display with the large picture screen and to do away with the above disadvantage (a) and to simplify the fabrication work and to reduce the manufacturing cost, to do away with the above disadvantage (b) and to maintain the periodicity with which the pixels are arrayed on the whole of the picture screen after fabrication, to do away with the above disadvantage (c) and to prevent a picture quality from being deteriorated due to the boundary between the transparent substrates, and to do away with the above disadvantage (d) and to realize the picture screen of the high resolution.

While the organic EL display has been described so far by way of an example, it is unavoidable that direct-view-type display apparatus other than the organic EL display encounters at least the above disadvantages (a) to (d) when a display element is formed as a unit and a plurality of display units are disposed in a matrix fashion.

SUMMARY OF THE INVENTION

Accordingly, the present invention is to provide a direct-view-type display apparatus other than the organic EL display in which a large picture screen can be realized, the fabrication work can be simplified, the manufacturing cost can be reduced, the periodicity with which the pixels are arrayed on the whole of the picture screen can be maintained and the deterioration of the picture quality can be prevented.

To solve these problems, a direct-view-type display apparatus according to the present invention is characterized in that a plurality of display elements are formed on a single transparent substrate and driver circuits for supplying signals to signal electrodes and scanning electrodes of these display elements are provided in response to respective display elements.

In this direct-view-type display apparatus, a plurality of display elements are not formed as units like the prior art but are formed on a single, common transparent substrate. Then, when signals are supplied to the respective display elements from the corresponding driver circuits, an image is displayed on one picture screen of this transparent substrate.

Because a plurality of display elements are formed on the single, common transparent substrate as described above, the periodicity with which the pixels are arrayed on the whole of the picture screen can be maintained without positioning the display units with high accuracy unlike the prior art, the large picture screen can be realized, the fabrication work can be simplified and the manufacturing cost can be reduced.

Because the positional relationship between the display elements can be prevented from being shifted after fabrication unlike the case in which a plurality of display units are disposed in a matrix fashion, the periodicity with which the pixels are disposed on the whole of the picture screen can be maintained after fabrication.

Since there does not exist the boundary between the transparent substrates of the respective display units unlike the prior art, the picture quality can be prevented from being deteriorated due to the above boundary.

In this direct-view-type display apparatus, by way of an example, it is suitable that the circuit substrate on which the driver circuits are mounted in response to the respective display elements are disposed on the back side (opposite to the display surface).

Since the positioning of the circuit substrate relative to the display element is required to such an extent that the driver circuits may electrically be connected to the electrodes of the display elements, the highly-accurate positioning of the display units is not required unlike the prior art. Therefore, the fabrication work can be prevented from becoming complicated and the manufacturing cost can be prevented from being increased.

When the display element is the organic EL element (i.e., organic EL display), by way of an example, the height of the signal electrode and the height of the scanning electrode of the organic EL element on the transparent substrate are made substantially equal to each other. The circuit substrate is made of a material having end-sealing property and has through-holes bored at its positions opposing to the signal electrode and the scanning electrode. The through-holes are buried by a material having end-sealing property and conductivity. While the through-holes are being opposed to the signal electrode and the scanning electrode, the circuit substrate is closely bonded to the organic EL element. Signals are supplied from the driver circuit through the material having the end-sealing property and the conductivity. The organic EL element is covered at its portion which is not bonded to the circuit substrate with an end-sealing material.

Since the organic EL element is sealed by the circuit substrate, the material having an end-sealing property and a conductivity and the end-sealing material while the space between the adjacent organic EL element on the transparent substrate is being kept narrow, the pixel pitch can be reduced, and therefore the organic EL display with high resolution can be realized.

By way of an example, it is suitable that the transparent substrate should be formed of a film-like substrate. According to this arrangement, not only a flat picture screen can be formed but also a curved picture screen can be formed by curving this transparent substrate.

By way of another example, it is suitable that the side surface of the circuit substrate should be covered with a member having an elasticity. According to this arrangement, even if the circuit boards are butted against each other when the circuit boards are disposed or the curved picture screen is formed by curving the transparent substrate, the circuit boards can be prevented from being chipped or scratched.

These and other objects and features of the present invention will become clear from the following description of the preferred embodiments given with reference to the accompanying drawings, in which:

DESCRIPTION OF THE PREFERRED EMBODIMENTS

An example in which the present invention is applied to an organic EL display will be described below.

Figure 1:
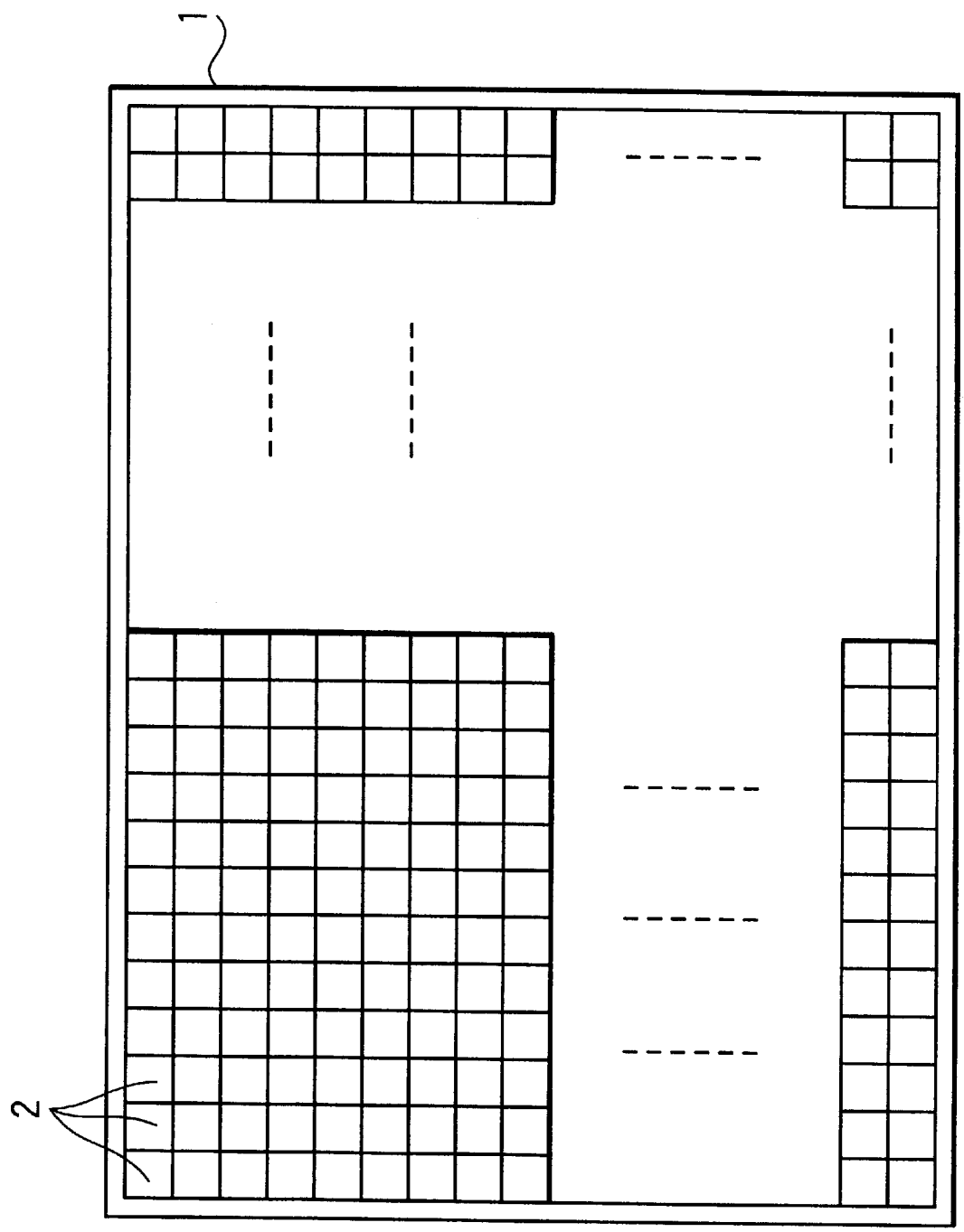
FIG. 1 is a plan view showing an example of an arrangement of an outward appearance of an organic EL display to which the present invention is applied.

FIG. 1 shows an example of an arrangement of an outward appearance of a panel portion of an organic EL display to which the present invention is applied from the panel display surface side. In this organic EL display, a plurality of organic thin-film elements 2 are formed in a matrix fashion on the rear surface (surface on the opposite side of the panel display surface) of one glass transparent substrate 1. The transparent substrate 1 has a dimension corresponding to a screen size of indoor and outdoor big-screen display.

Figure 2:
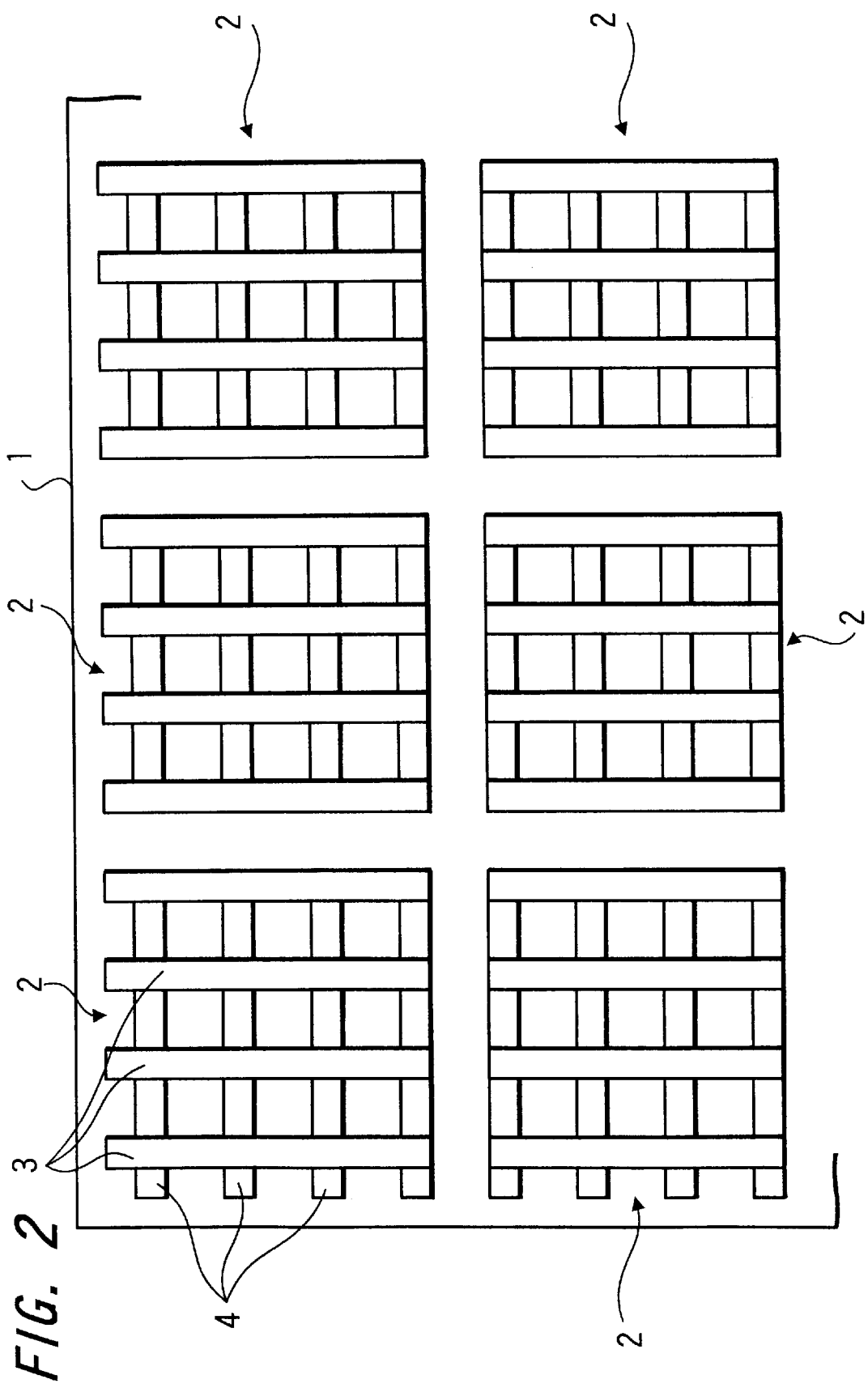
FIG. 2 is a plan view showing an example of an arrangement of a portion of an individual organic thin-film EL element of the organic EL display shown in FIG. 1.
Figure 3:
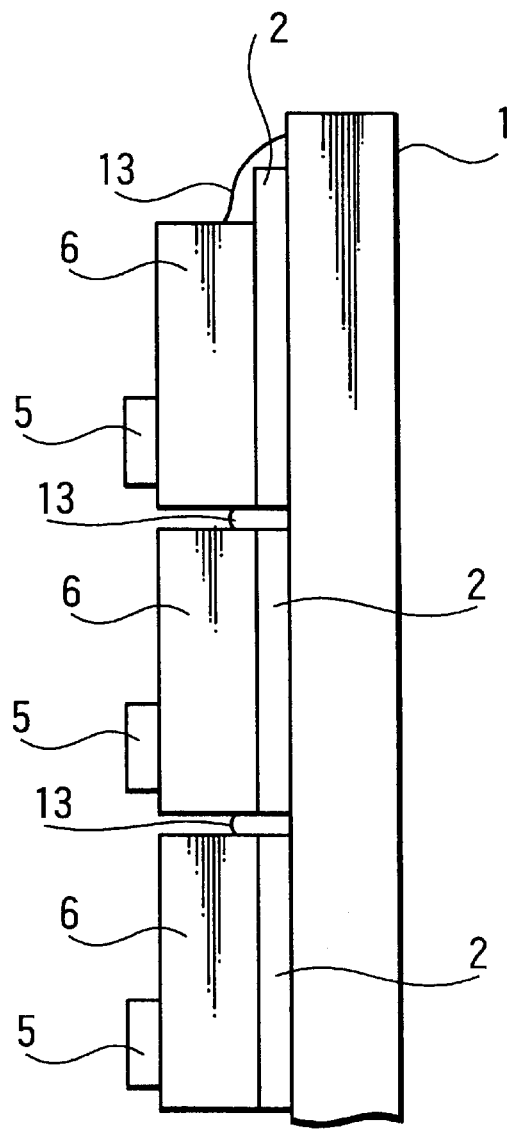
FIG. 3 is a cross-sectional side view showing an example of an arrangement of a portion of an individual organic thin-film EL element of the organic EL display shown in FIG. 1.
Figure 3:
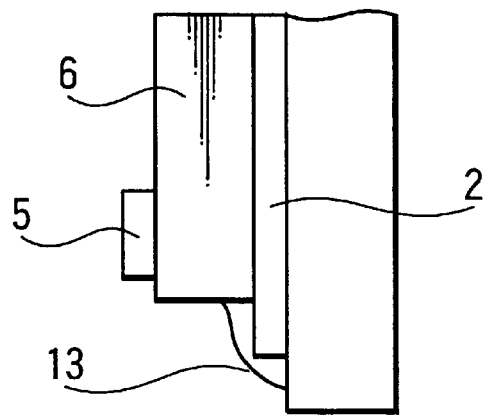

FIGS. 2 and 3 show examples of arrangements of individual thin-film EL elements 2 of this organic EL display from the panel display surface side and the side surface side, respectively.

As shown in FIG. 2, each organic thin-film EL element 2 includes anodes (signal electrodes) 3 and cathodes (scanning electrodes) 4, each of which is a predetermined number (e.g., four).

A space between the adjacent organic thin-film EL element 2 is made equal to a space between these electrodes within the organic thin-film EL element 2, whereby periodicity with which pixels are arrayed on the whole of the screen is maintained.

The signal electrode 3 is formed of a transparent electrode made of ITO (indium-tin oxide), for example. The scanning electrode 4 is formed of an electrode made of metal alloy such as aluminum and lithium.

As a method of forming the signal electrodes 3, there is used a method in which after a signal electrode had been formed over substantially the whole range of the longitudinal direction of the transparent substrate 1, for example, this signal electrode is removed by etching at portions corresponding to the boundaries of the respective organic thin-film EL element 2 in the longitudinal direction of the transparent substrate 1. Consequently, the signal electrodes 3 of each organic thin-film EL element 2 are formed at the same time.

As a method of forming the scanning electrodes 4, there is used a method in which after portions corresponding to boundaries of the respective organic thin-film EL elements 2 in the lateral direction of the transparent substrate 1, for example, has been masked, a metal which serves as a material of the scanning electrodes 4 is deposited over substantially the whole range of the lateral direction of the transparent substrate 1 by vapor deposition. Consequently, the scanning electrodes 4 of each organic thin-film EL element 2 also are formed at the same time.

As shown in FIG. 3, circuit substrates 5 are disposed on the rear surface side (the opposite side of the panel display surface) in response to the respective organic thin-film EL elements 2. The circuit substrate 5 has mounted thereon a driver circuit 6 for supplying signals (display signal and scanning signal) to the signal electrode 3 and the scanning electrode 4 of the corresponding organic thin-film EL element 2.

Figure 4:
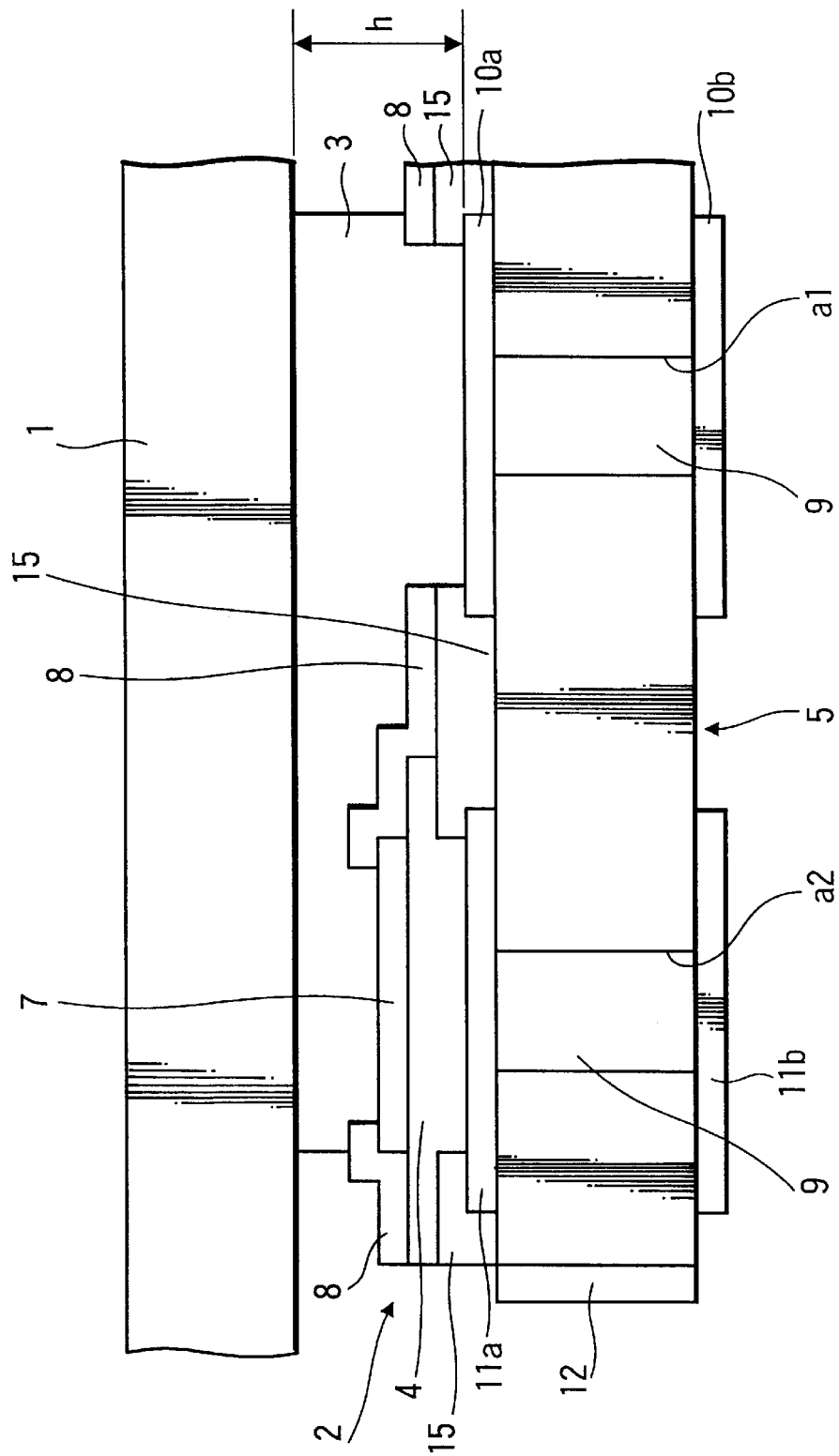
FIG. 4 is a cross-sectional side view showing more detailed structures of the organic thin-film EL element and the circuit substrate shown in FIGS. 2 and 3.

FIG. 4 is a diagram showing more in detail the structure of the organic thin-film EL element 2 and the circuit substrate 5 from the side surface side. The signal electrode 3 of each organic thin-film EL element 2 has a range (height h in the sheet of drawing) in which its height on the transparent substrate 1 is substantially equal to the scanning electrode 4 (height h in the sheet of drawing) at a portion which is not intersected by the scanning electrode 4. A thin-film like organic layer 7 is formed at a portion (pixel portion) at which the signal electrode 3 and the scanning electrode 4 cross with each other.

The organic layer 7 is comprised of an organic hole transport layer, an organic light-emitting layer and an organic electron transport layer (as another example, the organic layer is comprised of only the organic hole transport layer and an organic light-emitting layer having an electron transport property), though not shown.

The signal electrode 3 and the scanning electrode 4 are separated by an insulating layer 8 formed on the signal electrode 3 by vapor deposition.

The circuit substrate 5 is the substrate made of the same glass as that of the transparent substrate 1. The circuit substrate 5 has a through-hole a1 within the area opposing to the range (height h) in which the height of each signal electrode 3 of the organic thin-film EL element 2 is substantially equal to the scanning electrode 4 and has also a through-hole a2 within the area opposing to the range excepting the portion (pixel portion) in which each scanning electrode 4 of the organic thin-film EL element 2 and the signal electrode 3 cross each other.

The respective through-holes a1, a2 are buried with conductive pastes (e.g., silver pastes) 9 using epoxy resin as a binder, respectively. The silver pastes 9 of the respective through-holes a1 are covered at respective substrate surfaces of the circuit substrate 5 with metal films 10a and 10b consisting of four layers of chromium, copper, nickel and gold.

The silver pastes 9 of the respective through-holes 2a are covered at respective substrate surfaces of the circuit board 5 with metal films 11a and 11b having the same structures as those of the metal films 10a and 10b. On the substrate surface of the side (lower side on the sheet of drawing) in which the driver circuit 6 are mounted as shown in FIG. 3, there is formed wiring (not shown) by which the metal films 10b, 11b are connected to the driver circuits 6.

Figure 5:
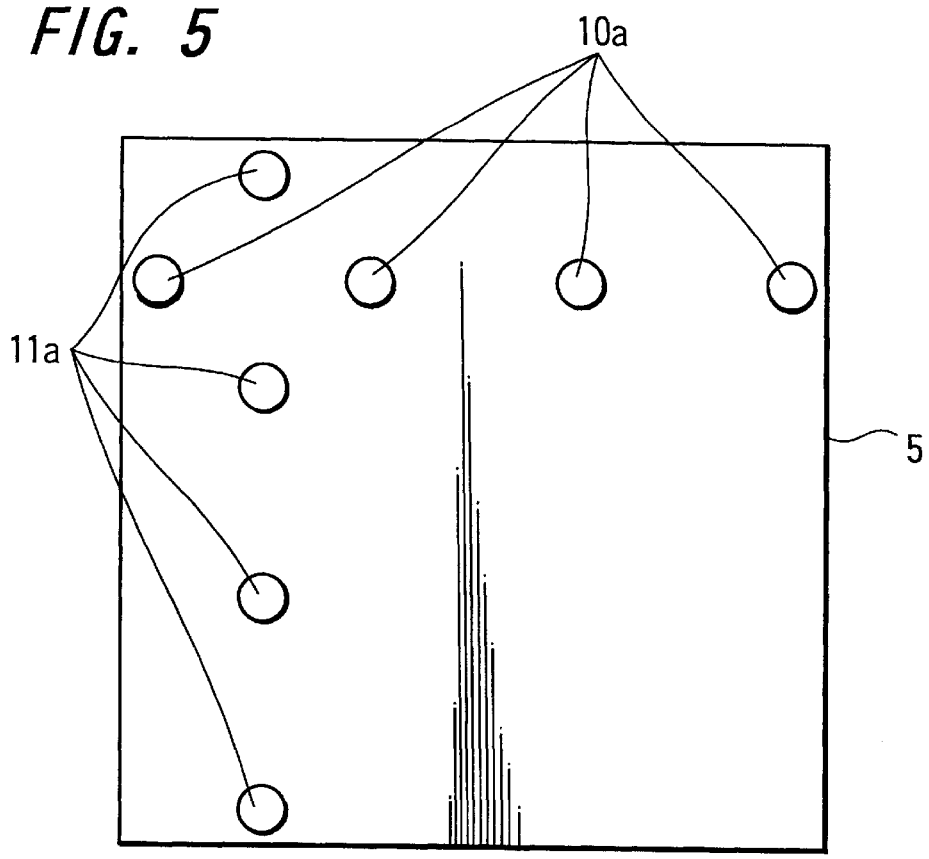
FIG. 5 is a diagram showing the positions of the metal films shown in FIG. 4 from the substrate surface side.

FIG. 5 shows the positions of the metal films 10a, 11a on the circuit substrate 5 from the substrate surface side.

As a method of forming the through-holes a1, a2 and the metal films 10a, 10b, 11a and 11b, there is used a method which will be executed in the following order (1) to (5), for example.

Figure 6A:
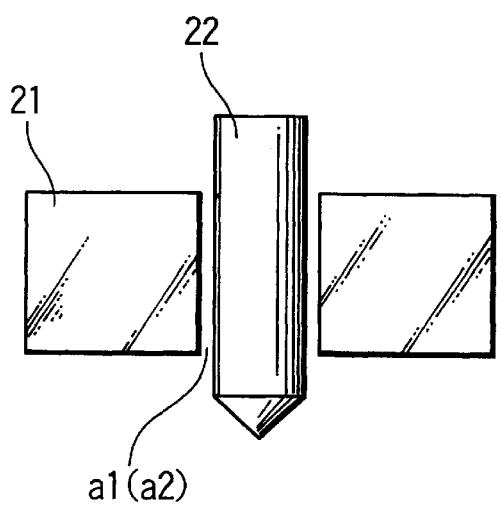
FIG. 6 are diagrams showing a method of forming the through-holes shown in FIG. 4.
Figure 6B:
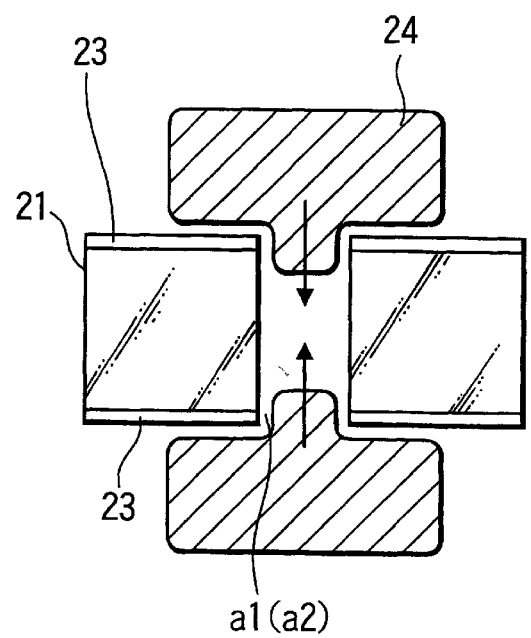

(1) The through-holes a1, a2 are bored on a glass substrate 21 used as the circuit substrate 5 by a diamond drill 22 as shown in FIG. 6A. Alternatively, as shown in FIG. 6B, other portions than the portions corresponding to the through holes a1, a2 are masked by masking films 23 and then the through-holes a1, a2 are formed by sandblast (method of blasting sand or grinding material 24 at a high speed).

Figure 7A:
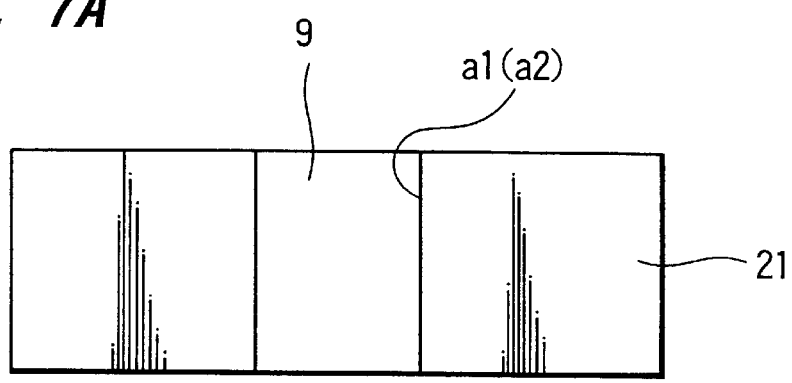
FIG. 7 are diagrams showing a method of forming the metal films shown in FIG. 4.

(2) As shown in FIG. 7A, after the through-holes a1, a2 have been buried with the silver pastes 9, the silver paste 9 is removed at its portion protruded from the substrate surface of the glass substrate 21 by mechanical polishing.

Figure 7B:
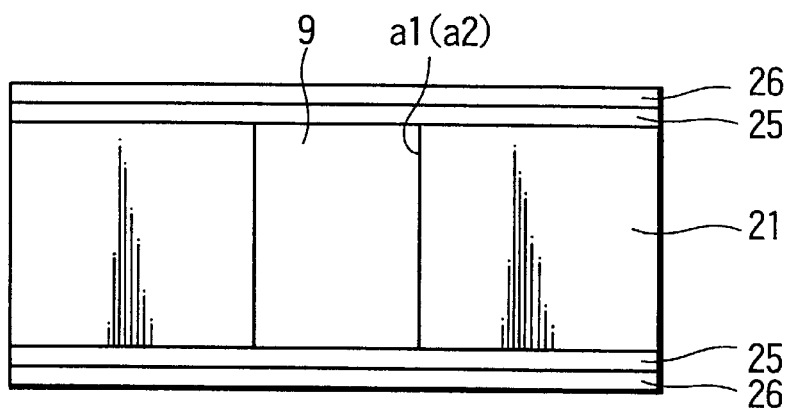

(3) As shown in FIG. 7B, after chromium 25 having excellent glass adhesion has been deposited on both substrate surfaces of the glass substrate 21 by vapor deposition, respectively, copper 26 having excellent conductivity is deposited on the both surfaces of the chromium, respectively, by vapor deposition.

Figure 7C:
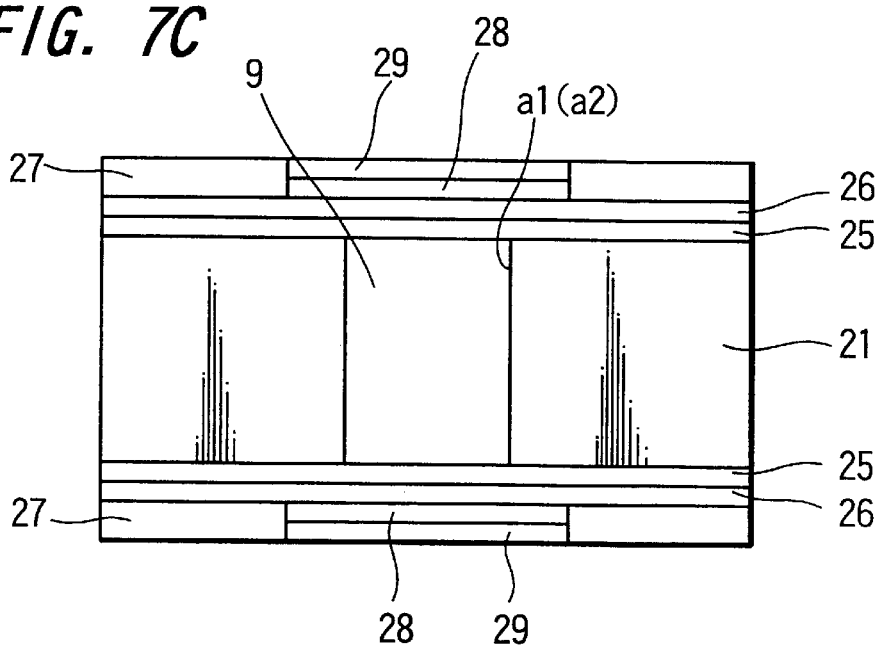

(4) As shown in FIG. 7C, after resist 27 has been formed on the portions other than the through-holes a1, a2 and the nearby portions, nickel 28 and gold 29 having anti-oxidation effect are deposited on the copper 26 of the through-holes a1, a2 and the nearby portions, in that order. The gold 28 is also used to facilitate soldering required to form wiring for connecting the metal films and the drive circuits 6 shown in FIG. 3.

Figure 8A:
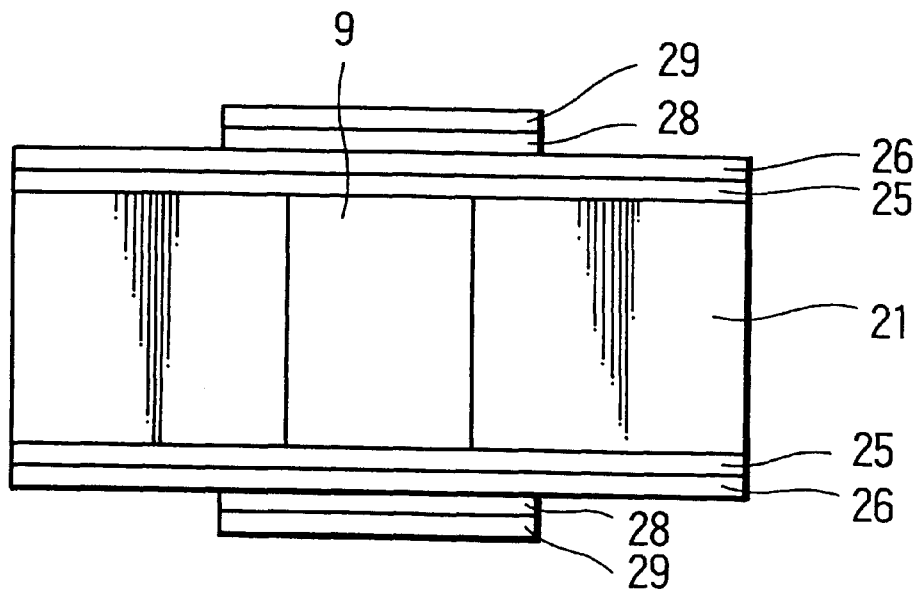
FIG. 8 are diagrams showing a method of forming the metal films shown in FIG. 4.
Figure 8B:
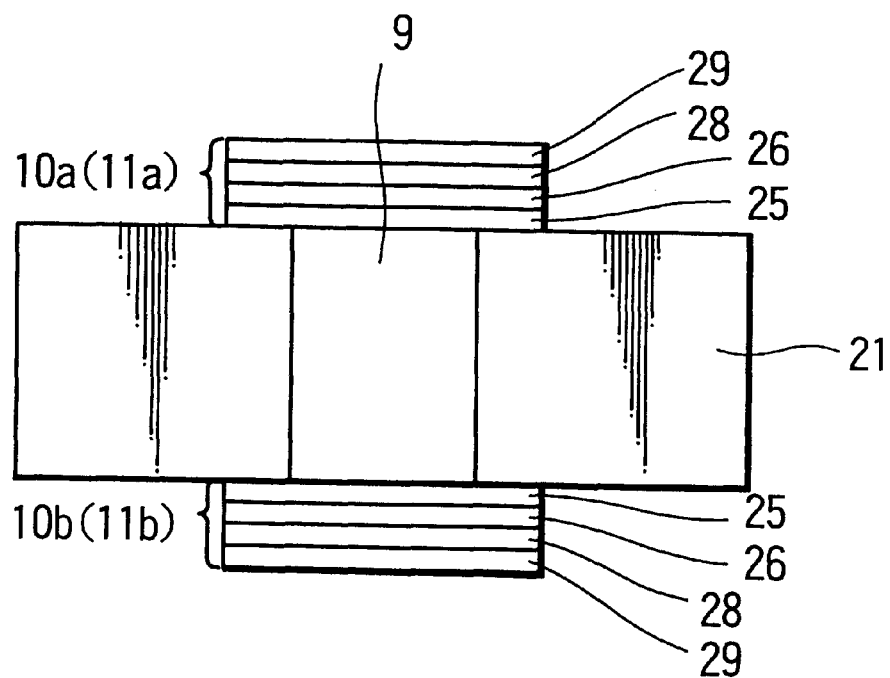

(5) After the resist 27 has been removed as shown in FIG. 8A, the chromium 25 and the copper 26 deposited on other portions than the through-holes a1, a2 and the nearby portions are removed by etching as shown in FIG. 8 B. Consequently, there are formed the metal films 10a and 10b, 11a and 11b comprised of the four layers of the chromium 25, the copper 26, the nickel 28 and the gold 29.

As shown in FIG. 4, the side surface of the circuit substrate 5 is covered with a protecting film 12 made of silicon rubber. The circuit substrate 5 is closely joined to the organic thin-film EL element 2 in the way that the respective metal films 10a, 11a are respectively contacted with the signal electrode 3 and the scanning electrode 4.

As a method of joining the circuit substrate 5 and the organic thin-film EL element 2, while polyester, vinyl chloride, vinyl acetate, polyamide or polyurethane thermoplastic resin 15 is being softened by heating, after this thermoplastic resin has been coated on the circuit substrate 5 at its portions other than the metal films 10a and 11a and the circuit substrate 5 and the organic thin-film EL element 2 have been put into pressurized contact with each other, this thermoplastic resin 15 is cooled and cured.

As shown in FIG. 3, each organic thin-film EL element 2 is covered at its portion, which is not joined to the circuit substrate 5, with an end-sealing material 13 made of epoxy resin which is resin having end-sealing property. As a method of covering the above portion with the end-sealing material 13, there is used a method in which after an adhesive agent made of epoxy resin, for example, has been coated, such adhesive agent is cured.

The driver circuit 6 on each circuit substrate 5 supplies a signal to the signal electrode 3 of the corresponding organic thin-film EL element 2 through the wiring formed on the substrate surface of the circuit substrate 5 and the metal film 10b, the silver paste 9 and the metal film 10a shown in FIG. 4, and also supplies a signal to the scanning electrode 4 of the corresponding organic thin-film EL element 2 through the interconnection formed on the substrate surface of the circuit substrate 5 and the metal film 11b, the silver paste 9 and the metal film 11a shown in FIG. 4, whereby an image is displayed on the transparent substrate 1 which is served as one screen.

An example of an arrangement of the organic EL display to which the present invention is applied has been described so far. In this organic EL display, since a plurality of organic thin-film EL elements 2 are formed on the single, common transparent substrate 1, without requiring the highly-accurate positioning between the display units unlike the prior art, there can be maintained the periodicity with which the pixels are arrayed on the whole of the screen. Accordingly, the big screen can be realized, the fabrication work can be simplified and the manufacturing cost can be reduced.

Unlike the case in which the display units are disposed in a matrix fashion, the organic thin-film EL elements 2 can be prevented from being shifted from each other in the positional relationship after the manufacturing, and hence the periodicity with which the pixels are arrayed on the whole of the screen can be maintained after the manufacturing.

Unlike the case in which the display units are disposed in a matrix fashion, since the boundary between the transparent substrates of the display units does not exist, it is possible to prevent the picture quality from being deteriorated due to this boundary.

While the space between the adjacent organic thin-film EL elements 2 on the transparent substrate 1 is being kept narrow (while this space is being kept equal to the space between the signal electrode 3 and the scanning electrode 4 within the organic thin-film EL element 2), the organic thin-film EL element 2 is sealed by the circuit substrate 5 made of glass, the metal films 10a, 10b, 11a, 11b and the end-sealing material 13. Accordingly, since the pixel pitch can be reduced, the organic EL display with high resolution can be realized.

The circuit substrate 5 has only to be positioned with respect to the organic thin-film EL element 2 in a way that the through-holes a1, a2 are brought in contact with the signal electrode 3 and the scanning electrode 4, respectively (i.e., in a way that the driver circuit 6 is electrically connected to the signal electrode 3 and the scanning electrode 4).

Figure 9:
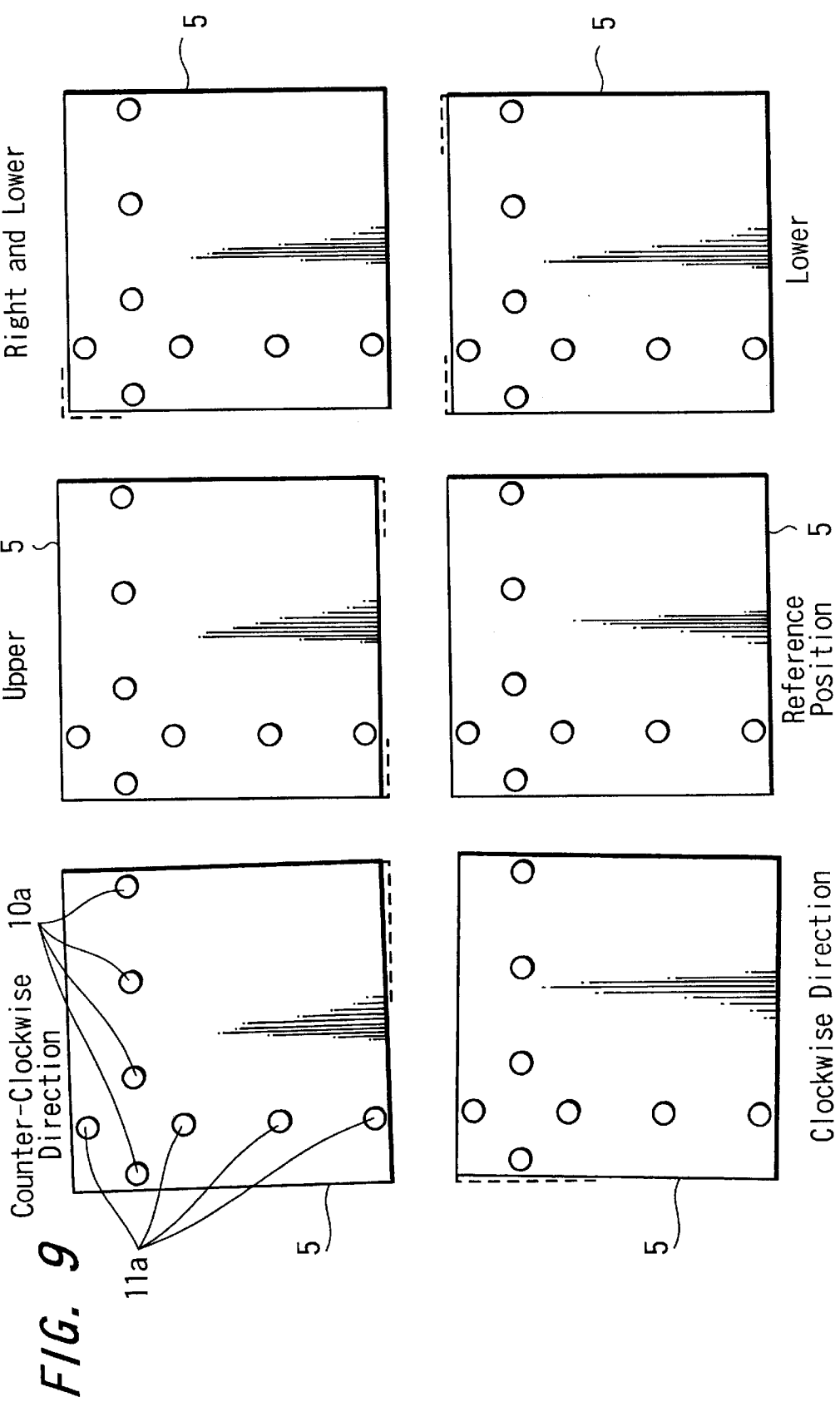
FIG. 9 is a diagram showing the state in which the position of the circuit substrate is shifted from the organic thin-film EL element.

FIG. 9 shows the state in which the positions of the five circuit substrates 5 of the circuit substrates 5 corresponding to the adjacent six organic thin-film EL elements 2 on the transparent substrate 1 are roughly shifted from the reference position (the position at which the circuit substrate is accurately disposed with respect to the organic thin-film EL element 2) to some extent such as in the counter-clockwise direction, in the upper direction, in the right and lower direction, in the clockwise direction and in the lower direction when they are seen from the panel display surface side. With respect to the respective circuit substrates 5 which are shifted in terms of position, part of the contour of the circuit substrate whose position is not shifted is shown by dashed lines.

Figure 10:
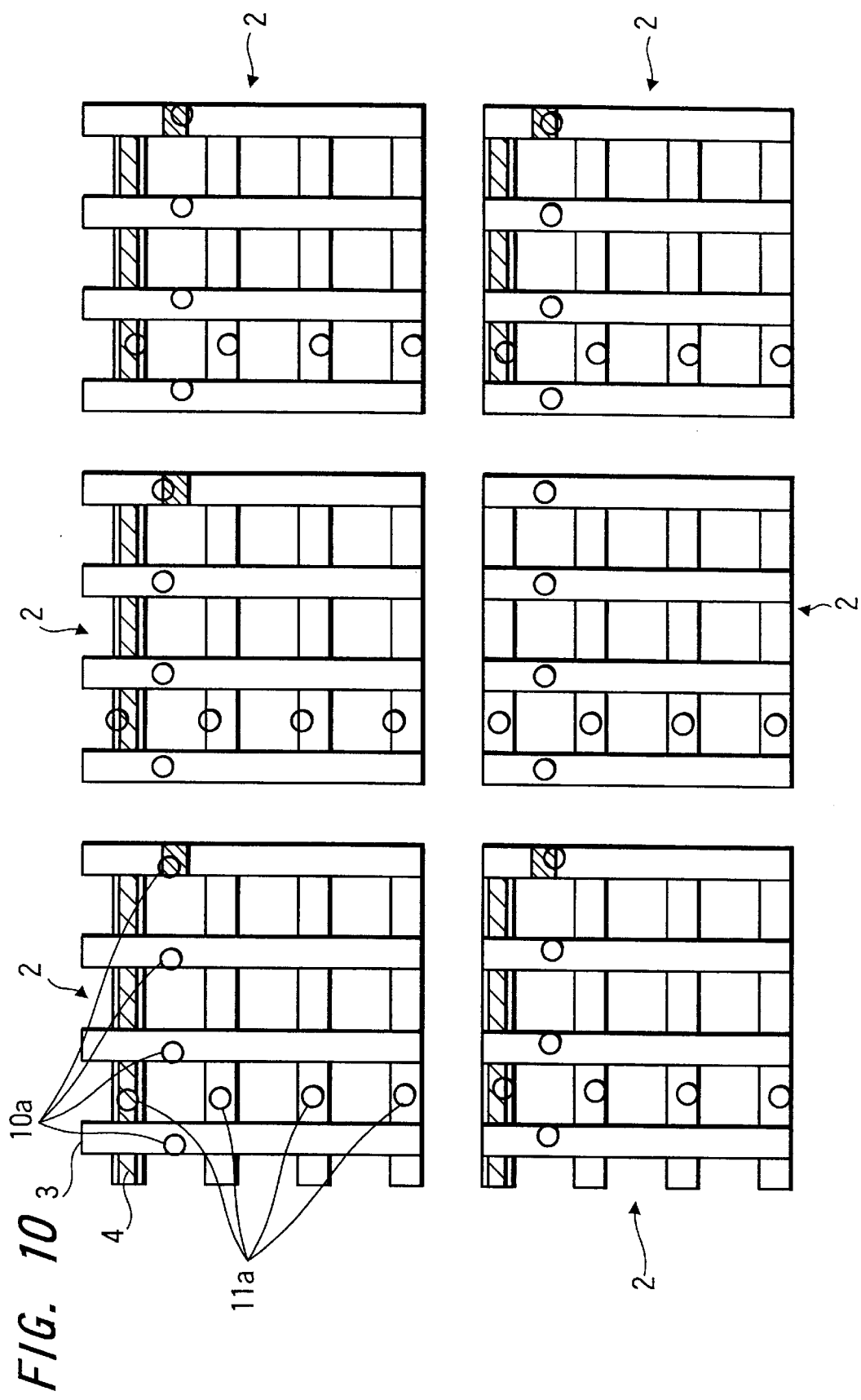
FIG. 10 is a diagram showing a positional relationship among signal electrodes, scanning electrodes and metal films of circuit substrates in the state shown in FIG. 9.

FIG. 10 shows a positional relationship among the signal electrode 3, the scanning electrode 4 and the metal films 10a, 11a obtained when the circuit substrates 5 are bonded to the organic thin-film EL elements 2 in the state shown in FIG. 9. In the respective organic thin-film EL elements 2 to which the circuit substrates 5, which are positionally shifted, are bonded, as for part of the signal electrode 3 and the scanning electrode 4 (the signal electrode 3 and the scanning electrode 4 which are most largely shifted from the metal films 10a, 11a in the organic thin-film EL element 2 to which the circuit substrates 5 shifted in the counter-clockwise direction and in the clockwise direction are bonded), ranges (the range of the height h in FIG. 4) in which the metal films 10a, 11a are contacted are shown hatched.

As shown in FIG. 10, in the state in which the positions of the circuit substrates are roughly shifted from the elements to some extent as shown in FIG. 9, the metal films 10a, 11a of the respective circuit substrates 5 are brought in contact with the signal electrodes 3 and the scanning electrodes 4 of the corresponding organic thin-film EL elements 2, respectively.

As described above, since the positioning of the circuit substrates 5 need not be executed with high accuracy as in the conventional displaying units this positioning does not cause the fabrication work to become complicated and the manufacturing cost to be increased.

Since the side surface of the circuit substrate 5 is covered with the protecting film 12 made of silicon rubber, even if the circuit substrates 5 butt into each other when the circuit substrates 5 are disposed on the elements, the circuit substrates 5 can be prevented from being cracked and scratched.

While the transparent substrate 1 made of glass is used in the above example, the present invention is not limited thereto and there may be used a transparent substrate made of a resin (acrylic resin such as PMMA (polymethyl methacrylate)).

Figure 11:
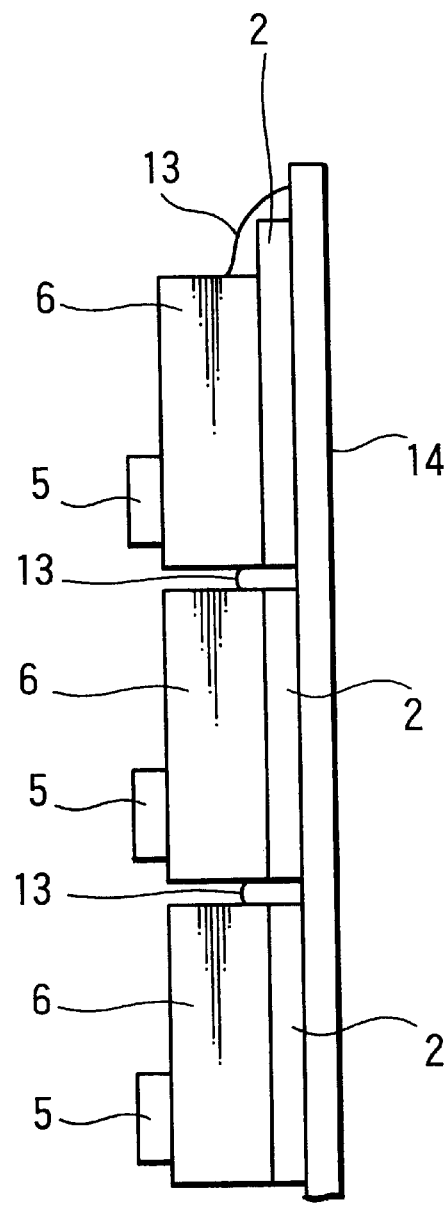
FIG. 11 is a diagram showing an example in which an arrangement of an organic EL display according to the present invention is modified.
Figure 11:
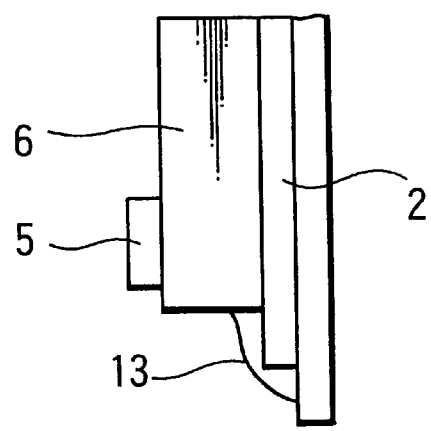
Figure 12:
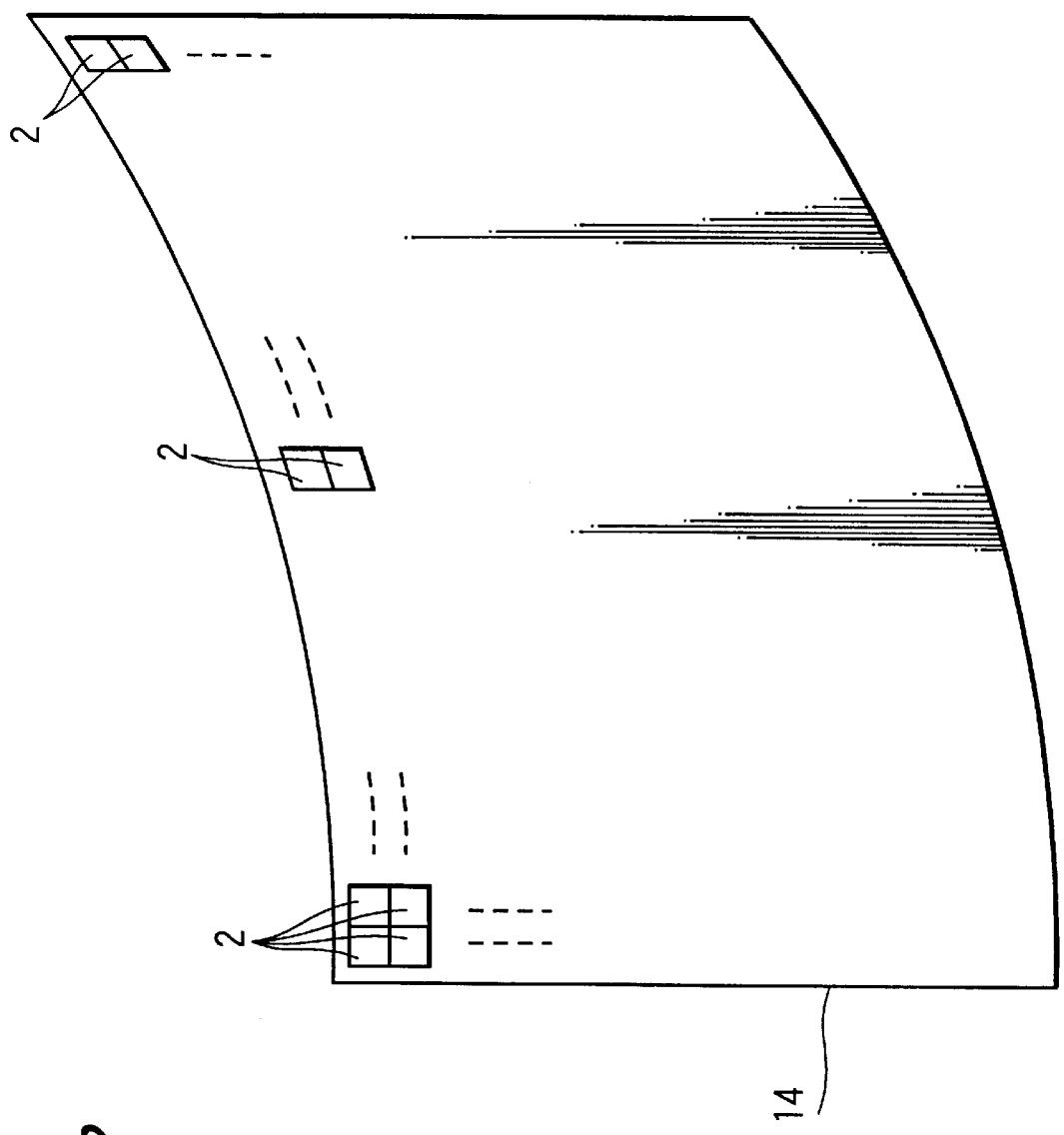
FIG. 12 is a diagram illustrative of the state in which the film-like transparent substrate shown in FIG. 11 is curved.
Figure 13:
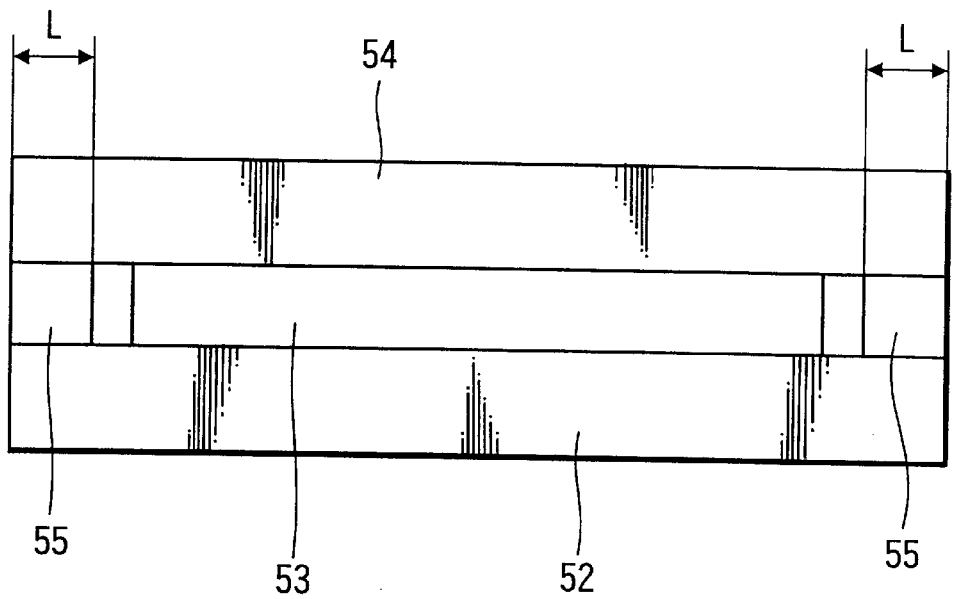
FIG. 13 is a cross-sectional side view showing an example of an arrangement of a display unit in which the organic thin-film EL element is as a unit.
Figure 14:
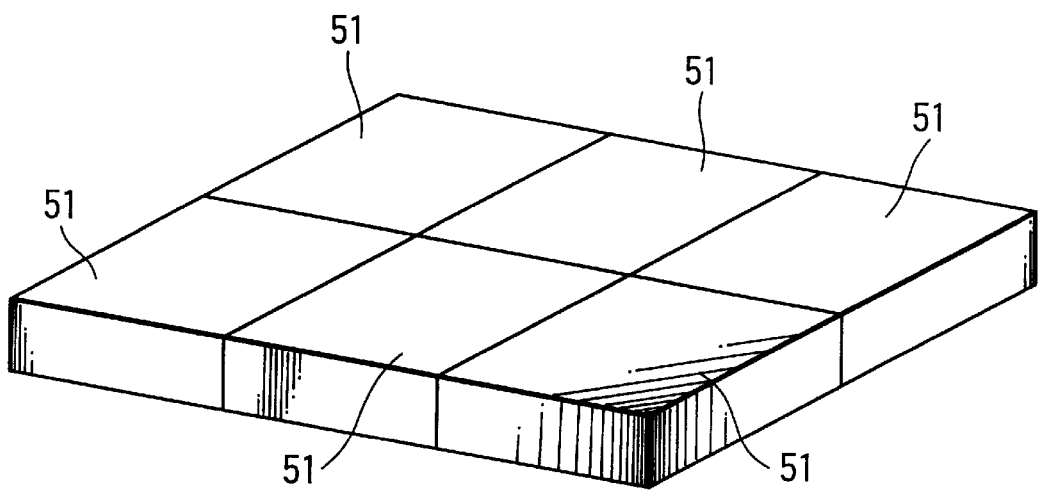
FIG. 14 is a diagram showing an example in which the display unit is disposed in a matrix fashion.

As such resin transparent substrate, there may be used a thin film-like transparent substrate 14 as shown in FIG. 11, whereby not only a flat screen can be formed but also a curved-surface-like screen can be formed by curving this film-like transparent substrate 14 slightly in the lateral direction as shown in FIG. 12 (while a convex surface-like screen is formed as shown in the sheet of drawing, it is needless to say that a concave surface-like screen can be formed). Further, since the side surface of the circuit substrate 5 is covered with the protecting film 12, even if the circuit substrates 5 butt into each other when the film-like transparent substrate 14 is curved, the circuit substrates 5 can be prevented from being cracked and scratched.

While each organic thin-film EL element 2 includes four signal electrodes 3 and four scanning electrodes 4 in the above example, the number of the signal electrodes 3 and the scanning electrodes 4 of each organic thin-film EL element 2 may be no more than three or no less than five.

In the above example, the range in which the height on the transparent substrate 1 is substantially equal to the scanning electrode 4 is provided at the portion in which the signal electrode 3 of the organic thin-film EL element 2 does not cross the scanning electrode 4. However, as a modified example, instead of providing the range in which the height on the transparent substrate 1 is high in the signal electrode 3, a gold bump may be formed on the silver paste within the through-hole of the circuit substrate 5 and this gold bump and the signal electrode 3 may be contacted with each other.

While the big-screen organic EL display is comprised of the single transparent substrate 1 in the above example, the present invention is not limited thereto and a bigger-screen organic EL display may be formed by disposing a plurality of transparent substrates 1 in a matrix fashion. In that case, since the number of the transparent substrates 1 thus disposed is considerably less than the number of display units required when one organic thin-film EL element is formed as units like the prior art, the fabrication work can be prevented from becoming complicated and the manufacturing cost can be prevented from being increased.

While the present invention is applied to the panel driven by a simple XY-matrix type in which the organic layer 7 is provided between the signal electrode 3 and the scanning electrode 4 as described above, the present invention is not limited thereto and can be applied to an active matrix type panel in which a TFT (thin film transistor) is formed on each organic EL element 2 and each organic EL element 2 is actively driven based on signals from the signal electrode 3 and the scanning electrode 4.

While the invention has been described with reference to the specific embodiment chosen for purpose of illustration, it should be apparent that numerous modifications could be made thereto by those skilled in the art without departing from the basic concept and scope of the invention.

As described above, according to the direct-view-type display apparatus of the present invention, the big-screen can be realized, the fabrication work can be simplified, the manufacturing cost can be reduced, the periodicity with which the pixels are arrayed on the whole of the screen can be maintained after the manufacturing, and the picture quality can be prevented from being deteriorated.

When the present invention is applied to the organic El display, there can be achieved the effect that the organic EL display with high resolution can be realized.

Having described preferred embodiments of the present invention with reference to the accompanying drawings, it is to be understood that the present invention is not limited to the above-mentioned embodiments and that various changes and modifications can be effected therein by one skilled in the art without departing from the spirit or scope of the present invention as defined in the appended claims.

What is claimed is:

1. A direct-view-type display apparatus comprising:
   a plurality of individual display elements placed on a single transparent substrate for forming a matrix display, wherein each of said plurality of individual display elements is an organic EL element having a height of a signal electrode substantially equal to a height of a scanning electrode;
   drive circuits provided in correspondence to said plurality of individual display elements for supplying signals to said individual display elements, wherein spaces formed among said plurality of individual display elements are filled with a sealing material including an epoxy resin; and
   a plurality of circuit substrates mounted on respective ones of said drive circuits, wherein each of said plurality of circuit substrates has through-holes bored at positions opposing said signal electrode and said scanning electrode, and said through-holes are covered by a conductive material having a sealing property.

2. The direct-view-type display apparat according to claim 1, wherein said single transparent substrate is a film-like substrate.

3. The direct-view-type display apparatus according to claim 1, wherein said single transparent substrate and said plurality of circuit substrates are formed of a glass material.

4. The direct-view-type display apparatus according to claim 3, wherein said single transparent substrate is a film-like substrate.

5. The direct-view-type display apparatus according to claim 3, wherein
   said plurality of circuit substrates are covered with an elastic material.

6. The direct-view-type display apparatus according to claim 3, wherein:
   each of said circuit substrates is joined to said organic EL element such that said through-holes are opposed to said signal electrode and said scanning electrode; and
   said drive circuits supply a signal to said signal electrode and said scanning electrode through said conductive material having a sealing property and said organic EL element is covered at a portion that is not jointed to said circuit substrates with said sealing material including said epoxy resin.

7. The direct-view-type display apparatus according to claim 6, wherein each of said plurality of circuit substrates is a film-like substrate.

8. The direct-view-type display apparatus according to claim 7, wherein a side surface of each of said plurality of circuit substrates is covered with an elastic material.

9. The direct-view-type display apparatus according to claim 6, wherein a side surface of each of said plurality of circuit substrates is covered with an elastic material.

* * * * *